US006534794B1

United States Patent
Nakanishi et al.

(10) Patent No.: US 6,534,794 B1
(45) Date of Patent: Mar. 18, 2003

(54) SEMICONDUCTOR LIGHT-EMITTING UNIT, OPTICAL APPARATUS AND OPTICAL DISK SYSTEM HAVING HEAT SINKING MEANS AND A HEATING ELEMENT INCORPORATED WITH THE MOUNTING SYSTEM

(75) Inventors: Hideyuki Nakanishi, Shiga (JP); Yoshiaki Komma, Osaka (JP); Yasuyuki Kochi, Osaka (JP); Akio Yoshikawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/633,234

(22) Filed: Aug. 4, 2000

(30) Foreign Application Priority Data

Aug. 5, 1999 (JP) ............................................. 11-222402

(51) Int. Cl.[7] ............................................. H01L 27/15
(52) U.S. Cl. ......................... 257/79; 257/233; 257/257; 257/184; 257/199; 257/212; 257/234; 257/252; 257/226; 257/277; 257/228
(58) Field of Search ................................. 257/227, 228, 257/226, 233, 257, 184, 199, 212, 234, 252, 79

(56) References Cited

U.S. PATENT DOCUMENTS

| | | | |
|---|---|---|---|
| 5,262,658 A | * | 11/1993 | Jankowsky |
| 5,923,825 A | * | 7/1999 | Orlicki et al. ............... 358/296 |
| 6,072,815 A | | 6/2000 | Peterson |
| 6,290,382 B1 | * | 9/2001 | Bourn et al. ................. 385/131 |
| 6,305,818 B1 | * | 10/2001 | Lebens et al. |

* cited by examiner

Primary Examiner—Fetsum Abraham
(74) Attorney, Agent, or Firm—Nixon Peabody LLP; Donald R. Studebaker

(57) ABSTRACT

A semiconductor light-emitting unit includes: a semiconductor laser diode; a photodetector functioning as a submount for mounting the diode thereon; and a heating member, incorporated with the photodetector, for heating the diode. If the ambient temperature of the diode falls within a range where kinks are possibly caused in the low-temperature I-L characteristic of the diode, then current is supplied to the heating member, thereby heating the diode. The heating member may be either a doped region defined within a semiconductor substrate or a doped polysilicon film formed on the substrate. Also, the heating member is preferably located under the laser diode with a heat-dissipating layer and an insulating layer interposed therebetween. The semiconductor light-emitting unit with this structure can effectively eliminate kinks from the low-temperature I-L characteristic of the semiconductor laser diode.

11 Claims, 11 Drawing Sheets

SEMICONDUCTOR LIGHT-EMITTING UNIT, OPTICAL APPARATUS AND OPTICAL DISK SYSTEM HAVING HEAT SINKING MEANS AND A HEATING ELEMENT INCORPORATED WITH THE MOUNTING SYSTEM

BACKGROUND OF THE INVENTION

The present invention generally relates to a semiconductor light-emitting unit including a semiconductor light-emitting diode and also relates to optical head apparatus and optical disk system including the light-emitting unit. More particularly, the present invention relates to measures to be taken to ensure good emission characteristics for the light-emitting diode.

Recently, various types of optical or magneto-optical disk systems have rapidly increased their demand and expanded their applications. These systems are used for optically writing, reading and erasing information onto/from a high-density, large-capacity optical or magneto-optical storage medium like optical disk or optical card using an optical memory. As for optical disks with a pit pattern, for example, digital audio disks, videodisks, document file disks and disks with data files have found broader and broader applications.

To write or read information onto/from a storage medium like an optical disk, an optical system is needed to make a light beam, which has been produced by a semiconductor light-emitting diode and then condensed to a spot of a very small size, incident on the storage medium. That is to say, to write or read the information onto/from the storage medium successfully and accurately, the optical system as a whole should be constructed with very high precision before everything else. For example, basic functions of an optical head apparatus, which is a key section of an optical disk system, are roughly classified into: condensing the light beam to a very small spot down to the limit of diffraction; performing focus and tracking controls over the optical system; and detecting a pit signal. These functions are implementable by appropriately combining various types of optical systems and photoelectric conversion methods depending on the intended applications. Examples of these combinations include: a semiconductor light-emitting unit including a semiconductor laser diode and a photodetector as a unit; an optical head apparatus (or an optical pickup) including the light-emitting unit, prism and lens; and an optical disk system (or optical disk drive) including the optical head apparatus and a storage medium.

As for an optical disk system applicable to compact discs (CDs), a semiconductor laser diode, operating at a wavelength of around 800 nm belonging to the so-called "infrared region" of the spectrum, has often been used as its light source. Recently, however, remarkable progress has been achieved in the design technologies for optical systems and semiconductor laser diodes, operating at an even shorter wavelength and yet producing far higher output power, have been developed one after another. As a result, the storage capacity of optical disks has also been increasing year after year.

Also, to provide a downsized and more reliable optical disk system or optical head apparatus at a lower cost, an optical system for an optical head apparatus is simplified by using a hologram according to a proposed technique. Such a technique is disclosed by Wai-Hon Lee in "Holographic Optical Head for Compact Disc Applications", Optical Engineering Vol. 28, No. 6, pp. 650–653 (1989).

In the optical disk systems like these, automatic power control (APC) is usually carried out to keep the intensity of radiation emitted from the semiconductor laser diode constant such that write and read operations can be performed even more stably and reproducibly using the semiconductor laser diode.

However, the known optical disk systems have a problem in the relationship between the amount of current I injected into a semiconductor laser diode and the intensity L of radiation emitted from the laser diode, which will be herein called "I-L characteristic".

FIG. 12 illustrates the I-L characteristics using the operating temperature of a semiconductor laser diode as a parameter. As shown in FIG. 12, the operating temperatures are defined by the three ambient temperatures of 0, 30 and 80° C. in the illustrated example. In FIG. 12, at room temperature (i.e., 30° C.), the radiation starts to be emitted from the semiconductor laser diode at a predetermined current value (i.e., a threshold current value). Then, a substantially linear relationship will be maintained between the current and the emission intensity until the intensity reaches a predetermined value. In contrast, at an elevated temperature (i.e., 80° C.), the amount of current needed to start the emission and the quantity of heat generated both increase compared to the room-temperature result. Accordingly, if a high intensity should be attained at such an elevated temperature, then the resultant I-L characteristic cannot be linear anymore. That is to say the gain of the emission with respect to the current supplied decreases. Such a bend of the I-L characteristic is curve, i.e., variation in differentiated intensity of emission with respect to the current value, will be herein called a "kink" of a high-temperature I-L characteristic.

If a semiconductor laser diode is operated under such conditions as causing the kink in the high-temperature I-L characteristic, then the APC control over an optical disk system including the laser diode will lose its stability. Also, if even higher output power should be attained (i.e., if the emission to be attained corresponds to a point on the high-temperature I-L characteristic curve which is even greater than the point where the kink is caused), the far field pattern (FFP) of the emission might be out of order, thus possibly deteriorating the convergence. Accordingly, the semiconductor laser diode should be operated under such conditions as eliminating the kinks from the high-temperature I-L characteristic and yet required emission intensity should be attained. However, to increase the emission intensity of the semiconductor laser diode, the amount of the current injected should be increased. Then, the operating temperature of the semiconductor laser diode rises from the ambient temperature, and therefore, the kink is more likely to be caused in the high-temperature I-L characteristic.

To solve this problem, a known semiconductor laser diode for optical disk system has its structure or material modified such that a greater amount of current can be supplied thereto at room temperature to attain the emission intensity exceeding that corresponding to the point where the kink is caused in the high-temperature I-L characteristic. For example, the amount of current supplied may be defined at the point A shown in FIG. 12. Another known semiconductor laser diode has its heat dissipation ability improved to minimize the temperature rise resulting from the injection of an increased amount of current.

However, if that type of semiconductor laser diode, which has its heat dissipation ability improved to eliminate kinks from the high-temperature I-L characteristic, is operated at a low ambient temperature, then a kink is caused in the low-temperature I-L characteristic when a large amount of current is supplied. For example, if the amount of current supplied is increased at a low temperature (e.g., 0° C. shown in FIG. 12), then a kink is observable in the I-L characteristic curve. Accordingly, if a known optical disk system, which has had its heat dissipation ability improved to eliminate the kinks from the high-temperature I-L characteristic, is used at a low temperature (e.g., 10° C. or less), then the kink is likely to be caused in the low-temperature I-L characteristic, thus possibly deteriorating its emission performance.

SUMMARY OF THE INVENTION

An object of the present invention is providing (1) a semiconductor light-emitting unit that can attain a high emission intensity in a broad temperature range by ensuring good heat dissipation ability for a semiconductor laser diode and by eliminating kinks from its low-temperature I-L characteristic, and (2) optical head apparatus and optical disk system including that unit.

An inventive semiconductor light-emitting unit includes: a semiconductor light-emitting diode; a sub-mount for mounting the diode thereon; and a heating member, incorporated with the sub-mount, for heating the diode.

In the inventive structure, the semiconductor light-emitting diode is heated by the heating member provided for the sub-mount along with the diode. Thus, the diode can be heated effectively, and therefore, kinks can be eliminated from the low-temperature I-L characteristic of the diode even if the ambient temperature is low.

In one embodiment of the present invention, the heating member preferably heats the diode up to such a temperature as substantially eliminating kinks from a low-temperature I-L characteristic of the diode.

In another embodiment of the present invention, the heating member may be a resistor. Then, the light-emitting diode can be heated using a simple structure, thus realizing a semiconductor light-emitting unit with high optical output power at a low cost.

In still another embodiment, the heating member is preferably located closely to the diode on the sub-mount.

In yet another embodiment, the sub-mount may be a semiconductor substrate, and the heating member may be a doped region defined inside the substrate. In such an embodiment, the heating member can be provided easily at a low cost by using the substrate.

In this particular embodiment, the heating member is preferably located below the diode, because the diode can be heated even more effectively in such an arrangement.

More preferably, the unit further includes an insulating layer and a heat-dissipating conductor layer that are formed between the heating member and the diode. In such an embodiment, the temperature of the light-emitting diode is arbitrarily controllable either by heating it or dissipating heat from it. Thus, almost no kinks are observable in the high- or low-temperature I-L characteristic of the diode.

In this case, the thickness of the insulating layer is preferably in the range from 0.1 µm to 1.5 µm, both inclusive, while the thickness of the conductor layer is preferably in the range from 10 µm to 20 µm, both inclusive. Then, the heat can be dissipated or generated highly efficiently.

In still another embodiment, the sub-mount may be the semiconductor substrate with light-receiving areas and may function as a photodetector. In such an arrangement, the light-receiving areas and the heating region can be integrated in a single semiconductor substrate.

In this particular embodiment, the sub-mount preferably has a recess, which is formed by removing part of the substrate from the upper surface thereof. The light-receiving areas are preferably formed on the upper surface of the substrate. And the doped region is preferably defined under the bottom of the recess. In such an embodiment, the light-emitting diode can be placed adaptively to the structure of an optical system used and yet can be heated very efficiently.

In this case, the semiconductor substrate preferably includes: a substrate region containing a dopant of a conductivity type opposite to that of the doped region; and a surface semiconductor layer of the same conductivity type as that of the substrate region. The semiconductor layer is preferably formed over the substrate region and has a dopant concentration lower than that of the substrate region. And the bottom of the recess preferably reaches the substrate region. In such an embodiment, the recess can be formed to a more accurate depth by taking advantage of difference in etch rate due to dopant concentrations.

In an alternative embodiment, the sub-mount may be a semiconductor substrate, and the heating member may be a polysilicon film formed on the substrate. Then, the heating member can also be provided easily at a low cost.

In yet another embodiment, the sub-mount may function as a photodetector with light-receiving areas.

In still another embodiment, the unit may further include: a mount for placing the sub-mount on a side face thereof; and a photodetector placed on the upper surface of the mount.

In still another embodiment, the unit may further include means for cooling the light-emitting diode down to such temperature as substantially eliminating kinks from a high-temperature I-L characteristic of the diode.

An inventive optical head apparatus includes: a semiconductor light-emitting diode; means for heating the diode up to such a temperature as substantially eliminating kinks from a low-temperature I-L characteristic of the diode; means for sensing the temperature of the diode; and a photodetector with light-receiving areas.

The optical head apparatus of the present invention with this arrangement can substantially eliminate kinks from the low-temperature I-L characteristic even at a low temperature.

An inventive optical disk system includes: a member for holding an information storage medium; a semiconductor light-emitting diode; means for heating the diode; means for sensing the temperature of the diode; a controller for controlling the heating means and getting the diode heated by the heating means up to such a temperature as substantially eliminating kinks from a low-temperature I-L characteristic of the diode if the temperature of the diode sensed by the sensing means falls within a range where the kinks are possibly caused in the low-temperature I-L characteristic; and a photodetector with light-receiving areas.

The optical disk system of the present invention with this arrangement can substantially eliminate kinks from the low-temperature I-L characteristic of the diode even at a low temperature.

In one embodiment of the present invention, the sensing means may sense the temperature of the diode from an operating current value of the diode corresponding to a predetermined emission intensity. In such an embodiment, the light-emitting diode can be heated quickly by a feed forward control.

In an alternative embodiment, the sensing means may also sense the temperature of the diode from a threshold current value of the diode.

In still another embodiment, the heating means is preferably incorporated with the photodetector. In such an arrangement, the optical disk system can be downsized and yet can heat the diode efficiently.

In yet another embodiment, the system preferably further includes means for cooling down the diode. The controller preferably controls the heating and cooling means such that the temperature of the diode falls within a range in which substantially no kinks are caused in the low- or high-temperature I-L characteristic of the diode.

DESCRIPTION OF THE PREFERRED EMBODIMENTS

Embodiment 1

Figure 1:
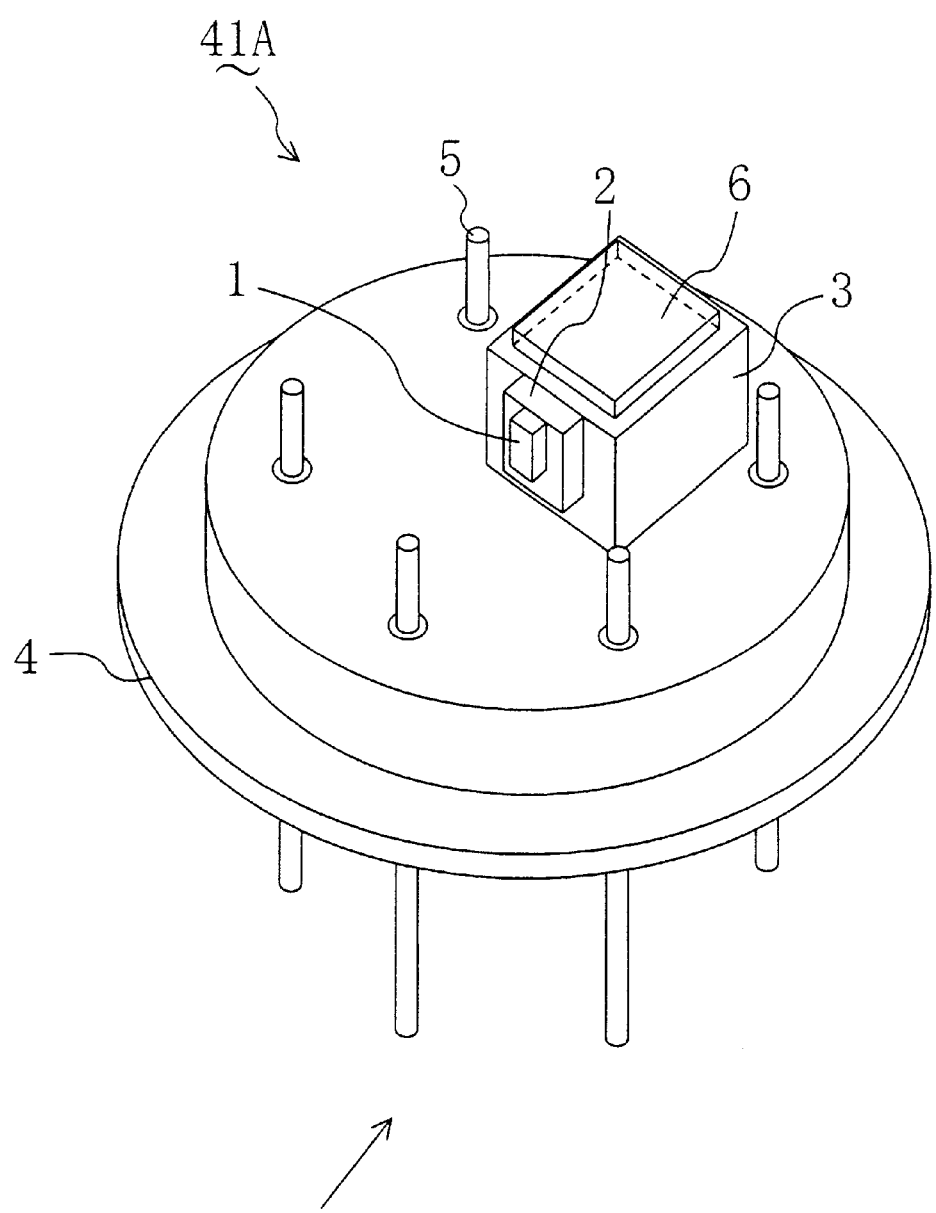
FIG. 1 is a perspective view schematically illustrating a construction of a semiconductor light-emitting unit according to a first embodiment of the present invention.

FIG. 1 is a perspective view schematically illustrating a construction of a semiconductor light-emitting unit 41A according to a first embodiment of the present invention. As shown in FIG. 1, the unit 41A includes semiconductor laser diode 1, sub-mount 2, mount 3, base 4, leads 5 and photodetector 6. The laser diode 1, i.e., an exemplary semiconductor light-emitting diode, is mounted on the sub-mount 2, which is in turn placed on a side face of the mount 3. And the mount 3, carrying these members thereon, is placed on the base 4. The leads 5 are attached to, but electrically insulated from, the base 4. And the photodetector 6 is placed on the upper surface of the mount 3.

In assembling these members of the semiconductor light-emitting unit 41A, the laser diode 1 is attached to the sub-mount 2 and then the sub-mount 2 is placed in its entirety onto one side face of the mount 3 to improve the assembly accuracy. The mount 3 is preferably made of a metal such as copper, while the sub-mount 2 is preferably a semiconductor chip of silicon (Si), for example. This is because a semiconductor chip usually has a good planar surface and can usually come into close contact with the laser diode 1. The cubic mount 3 is incorporated with the metallic base 4. The leads 5, connected to external units to transmit signals thereto, extend upward from the base 4. In the illustrated embodiment, the leads 5 are electrically insulated from the base 4. Optionally, some of the leads 5 may be electrically connected to the base 4.

In the semiconductor light-emitting unit 41A of the first embodiment, light is emitted from the laser diode 1 in the direction in which the leads 5 extend, i.e., upward in FIG. 1. Then, the light, reflected off from an optical disk (not shown), will be received at the photodetector 6 placed on the upper surface of the mount 3. In this manner, the semiconductor light-emitting unit 41A has its photodetector 6 and laser diode 1 integrated on the single base 4.

Figure 2:
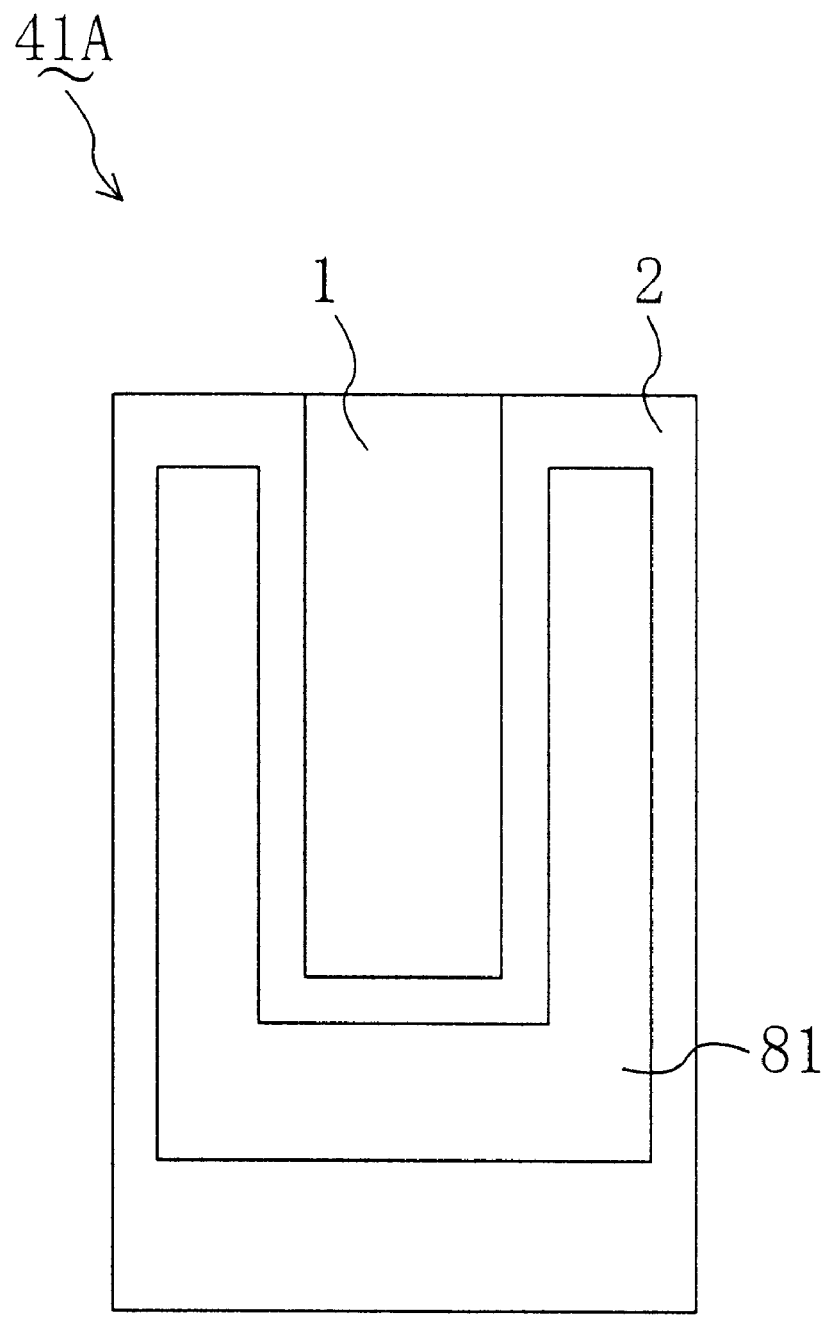
FIG. 2 is a plan view of the semiconductor laser diode and sub-mount as viewed in the direction indicated by the arrows in FIG. 1.

FIG. 2 is a plan view illustrating the semiconductor laser diode 1 and sub-mount 2 of the semiconductor light-emitting unit 41A as viewed in the direction indicated by the arrows in FIG. 1. As shown in FIG. 2, a heating region 81, made of a resistor, is provided on the principal surface of the sub-mount 2 to heat and surround the laser diode 1 from three sides. As will be described for a modified example of this embodiment and other embodiments, the heating region 81 may be either a polysilicon film formed on a semiconductor substrate as the sub-mount 2 or a doped region defined within the substrate. And if the ambient temperature is low enough to cause the kinks in the low-temperature I-L characteristic shown in FIG. 12 even when the heat generated from the laser diode 1 is taken into account, then current is supplied to the heating region 81, thereby warming the laser diode 1. In other words, by getting the laser diode 1 warmed up by the heating region 81, the kinks are eliminated from the low-temperature I-L characteristic such as that shown in FIG. 12. In this case, it depends on both the temperature at which the kinks are caused in the low-temperature I-L characteristic of the laser diode 1 and the ambient temperature of the laser diode 1 sensed by a temperature sensor (not shown) whether current should be supplied to the heating region 81 or not. Thus, this decision is made when the ambient temperature is lower than the temperature at which the kinks are caused in the low-temperature I-L characteristic, even if the heat generated from the laser diode 1 is taken into account. Generally speaking, however, the lower the operating temperature of a semiconductor laser diode, the smaller power the laser diode consumes and the longer the diode will be operable. Accordingly, if the ambient temperature is constant at about 10 or 15° C. or more, at which there is no concerns about the kinks in the low-temperature I-L characteristic, the supply of current to the heating region is preferably stopped.

Figure 3:
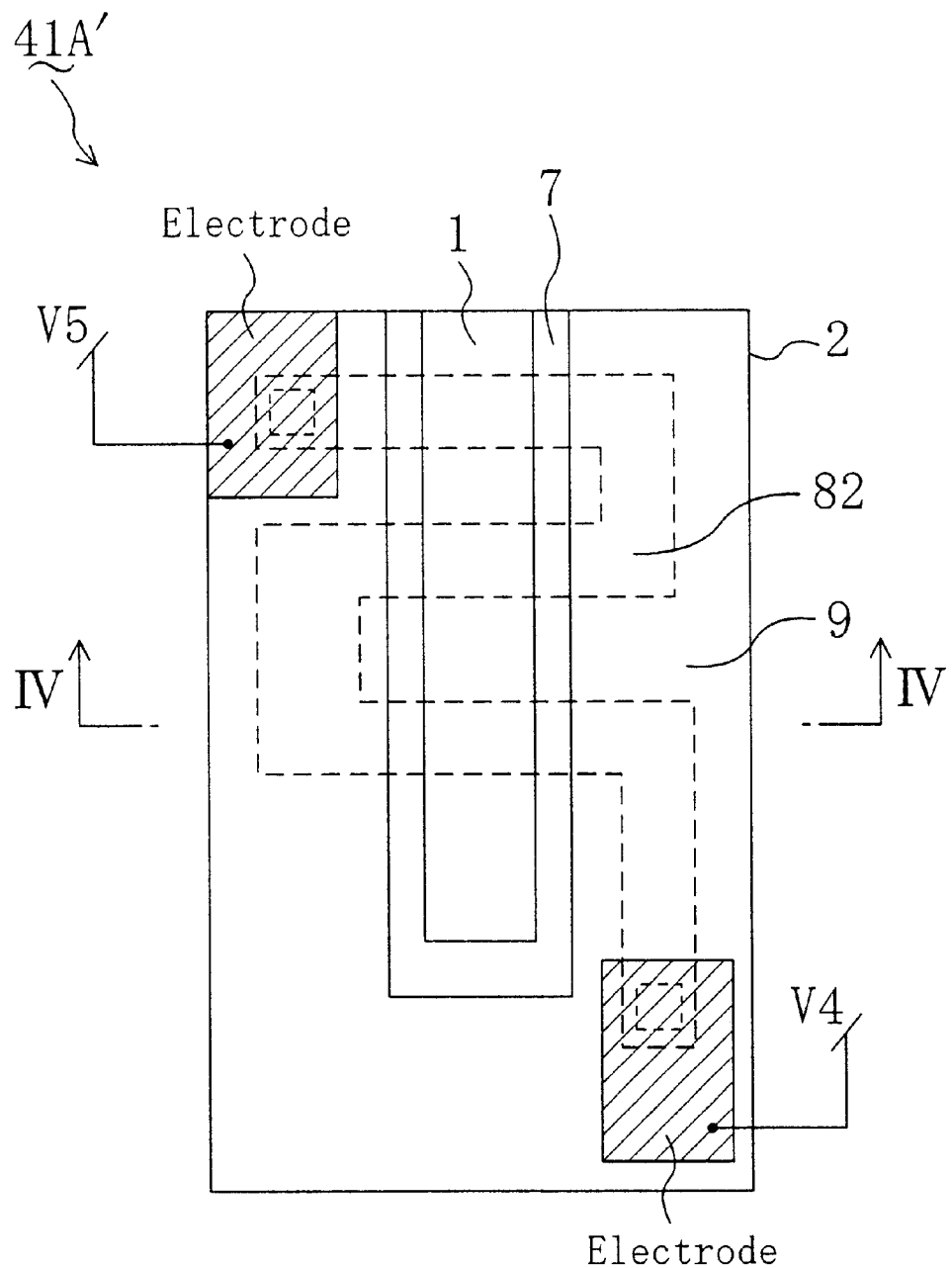
FIG. 3 is a plan view illustrating an arrangement for a semiconductor light-emitting unit according to a modified example of the first embodiment.

FIG. 3 is a plan view illustrating an arrangement for a semiconductor light-emitting unit 41A' according to a modified example of the first embodiment. In the light-emitting unit 41A' of this modified example, the laser diode 1 is placed on a heat-dissipating layer 7 made of a material with a high thermal conductivity (e.g., a metal), and the heating region 82 is located under the heat-dissipating layer 7 with an insulating layer 9 interposed therebetween. In this modified example, the heating region 82 is a doped region defined within a semiconductor substrate, which is used as an exemplary sub-mount 2, as will be described later. The insulating layer 9 may be a silicon dioxide film formed on the substrate.

Figure 4:
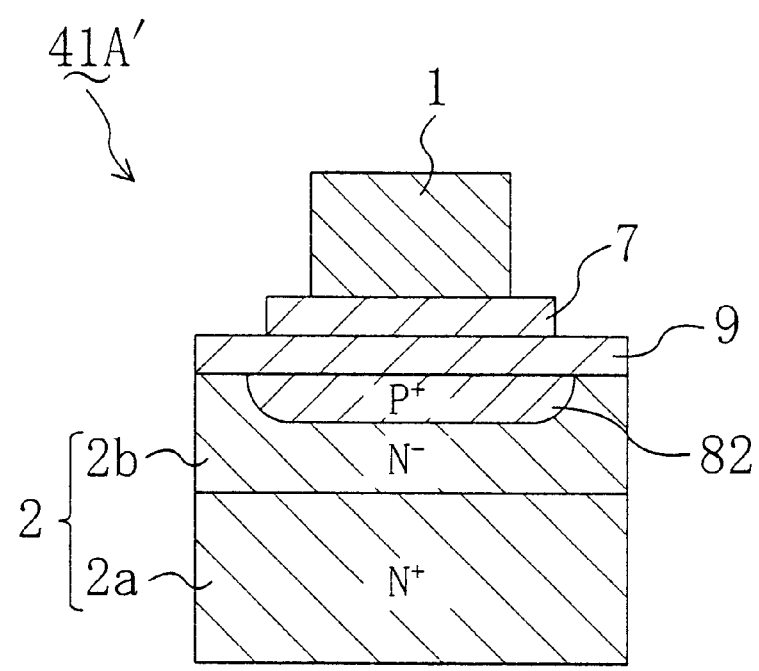
FIG. 4 is a cross-sectional view of the unit taken along the line IV—IV shown in FIG. 3.

FIG. 4 is a cross-sectional view of the unit 41A' taken along the line IV—IV shown in FIG. 3. As shown in FIG. 4, the semiconductor substrate (e.g., silicon substrate) as the sub-mount 2 includes: a substrate region 2a containing a high-concentration n-type dopant (e.g., arsenic); and a surface semiconductor layer 2b containing a low-concentration n-type dopant (e.g., arsenic). The surface semiconductor layer 2b is located over the substrate region 2a. In FIG. 4, the substrate region 2a and the surface semiconductor layer 2b are illustrated as $n^+$-type and $n^-$-type layers, respectively. In the sub-mount 2, the heating region 82 is also defined in part of the surface semiconductor layer 2b. The heating region 82 may be a $p^+$-type layer formed by introducing a high-concentration p-type dopant (e.g., boron) into that part of the surface semiconductor layer 2b at a dose of about $5 \times 10^{18}$ atoms·$cm^{-3}$. In the illustrated embodiment, the heating region 82 has a width of about 50 μm, a total length of about 1000 μm and a depth of about 0.1 μm. The heat-dissipating layer 7 for controlling the temperature rise of the laser diode 1 is formed under the laser diode 1 such that no kinks will be caused in the high-temperature I-L characteristic. In this modified example, the heat-dissipating layer 7 is made of a metal with a relatively high thermal conductivity and chemically high stability (e.g., gold (Au)), and has a thickness of about 12 μm. The insulating layer 9, made of CVD silicon dioxide, for example, is interposed between the heat-dissipating layer 7 and the semiconductor substrate 2. The thickness of the insulating layer 9 is about 1 μm in the illustrated embodiment. The insulating layer 9 should be both electrically insulating and thermally conductive. Two contact holes, which reach both ends of the heating region 82, are formed in the insulating layer 9 and two electrodes (not shown in FIG. 4) are formed by filling in these holes with a metal such as aluminum.

By applying voltages V4 and V5 (where V4≠V5) through these electrodes to both ends of the heating region 82, the heating region 82 is heated. It should be noted that the voltages V4 and V5 and a voltage applied to the substrate region 2a are reverse biased to the pn junction such that no current flows between the substrate region 2a and the heating region 82 in the semiconductor substrate. In the illustrated embodiment, the voltages V4 and V5 are both lower than the voltage applied to the substrate region 2a. Accordingly, if the substrate region 2a is grounded, then both of these voltages V4 and V5 are negative voltages. The conductivity types of the substrate region 2a and the heating region 82 may be reversed. That is to say, the substrate and heating regions 2a and 82 may be p- and n-type semiconductor regions, respectively.

In that case, the voltages V4 and V5 may be both higher than the voltage applied to the substrate region 2a.

In this modified example, by defining the heating region 82 under the semiconductor laser diode 1, the laser diode 1 can be heated efficiently with the current and power consumption both reduced such that kinks are eliminated from the low-temperature I-L characteristic. Also, by getting the heating region 82 wound as shown in FIG. 3, the heating region 82 located under the semiconductor laser diode 1 can have its resistance increased.

In this case, the heat-dissipating layer 7 needs to dissipate heat not only by radiating the heat into the air but also conducting the heat into the semiconductor substrate, and therefore should preferably have a thickness between 10 and 20 μm. To keep the heat-dissipating layer 7 and the heating region 82 electrically insulated from each other, the thickness of the insulating layer 9 is preferably 0.1 μm or more. However, to conduct a sufficient quantity of heat from the heating region 82 to the semiconductor laser diode 1, the insulating layer 9 should have a thickness of 1.5 μm or less. That is to say, the thickness of the insulating layer 9 is preferably in the range from 0.1 μm to 1.5 μm, both inclusive. We confirmed that when the Au heat-dissipating layer 7 and the CVD silicon dioxide insulating layer 9 were 10 and 1 μm thick, respectively, the resultant thermal conductivity increased by about 20% compared to a structure in which these layers were combined and both made of silicon alone.

Embodiment 2

Next, a second embodiment of the present invention will be described. In the second embodiment, the semiconductor laser diode and light-receiving areas are both placed on the same semiconductor substrate (or sub-mount), and the substrate (or sub-mount) of the light-emitting unit is made to function as a photodetector.

Figure 5:
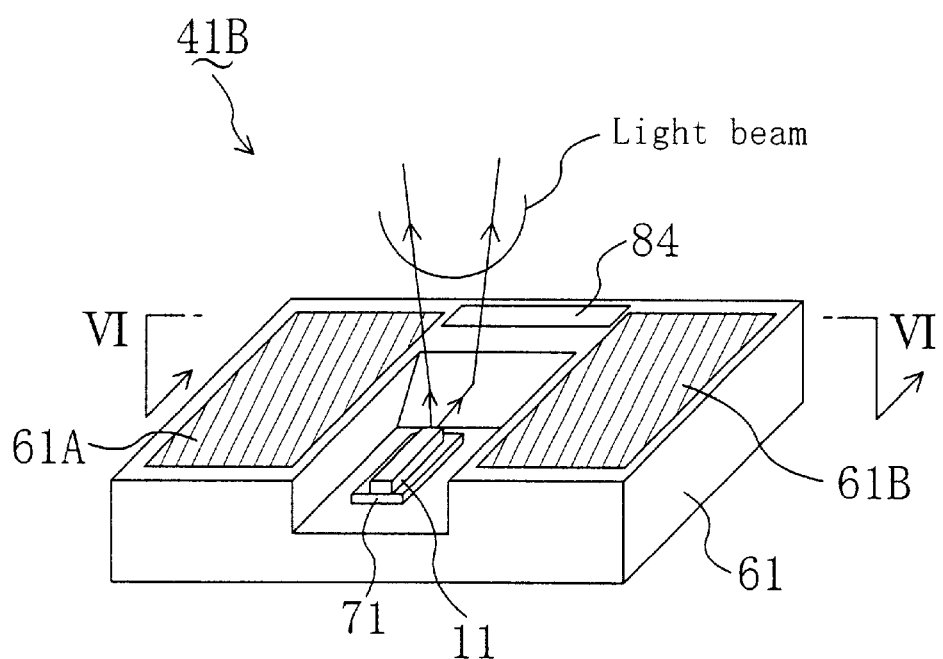
FIG. 5 is a perspective view schematically illustrating a construction of a semiconductor light-emitting unit according to a second embodiment of the present invention.

FIG. 5 is a perspective view schematically illustrating a construction of a semiconductor light-emitting unit 41B according to the second embodiment. As shown in FIG. 5, a recess is formed in a photodetector 61, which also serves as a sub-mount, by removing part of a semiconductor substrate from its upper surface to a certain depth. On the bottom of the recess, a semiconductor laser diode 11, which is an exemplary semiconductor light-emitting diode, is placed with an Au heat-dissipating layer 71 and an insulating layer (not shown in FIG. 5) interposed therebetween. One side face of the recess functions as a mirror tilted by about 45 degrees from the principal surface of the substrate. In this construction, the laser radiation emitted horizontally from the semiconductor laser diode 11 is reflected from the mirror almost vertically upward. Light-receiving areas 61A and 61B, which together make a light receiver, are defined on right-and left-hand sides of the recess on the upper surface of the photodetector 61. Specifically, the laser radiation, emitted from the semiconductor laser diode 11, is reflected vertically upward from the mirror of the recess so as to be incident on an information storage medium (not shown). Then, the light, which has been reflected from the storage medium, is divided by a hologram (not shown) into two light beams to be received at the light-receiving areas 61A and 61B, respectively. Furthermore, a heating region 84 for heating the semiconductor laser diode 11 is defined between the light-receiving areas 61A and 61B of the semiconductor substrate, or around the recess of the photodetector 61.

Figure 6:
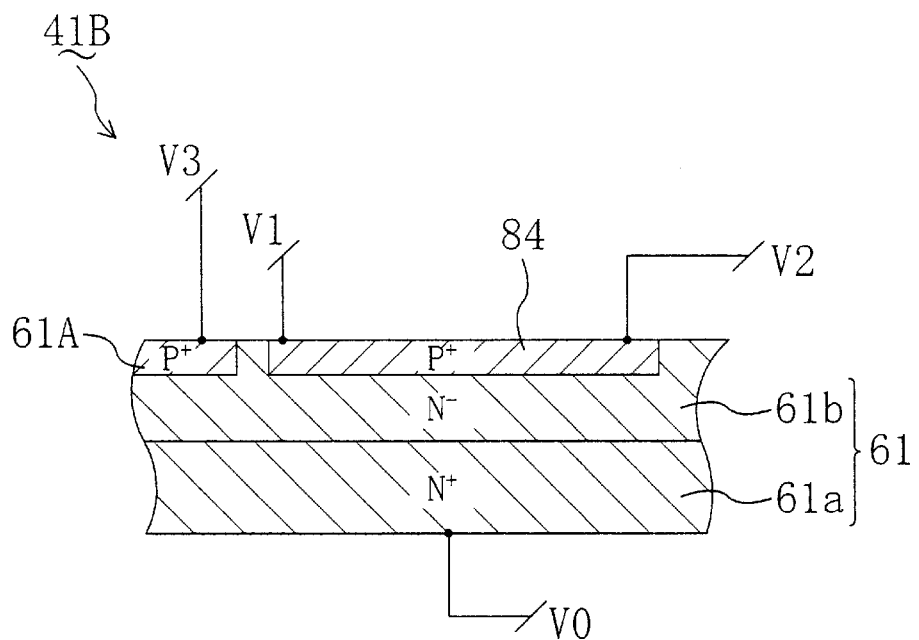
FIG. 6 is a cross-sectional view of the unit taken along the line VI—VI shown in FIG. 5.

FIG. 6 is a cross-sectional view of the semiconductor light-emitting unit 41B taken along the line VI—VI shown in FIG. 5. As shown in FIG. 6, the semiconductor substrate (e.g., silicon substrate) functioning as the photodetector 61 also includes: a substrate region 61a containing a high-concentration n-type dopant (e.g., arsenic); and a surface semiconductor layer 61b containing a low-concentration n-type dopant (e.g., arsenic). The surface semiconductor layer 61b is located over the substrate region 61a. In the photodetector 61, the heating region 84 is also defined in part of the surface semiconductor layer 61b by introducing a p-type dopant (e.g., boron) thereto at a dose of about $5 \times 10^{18}$ atoms·$cm^{-3}$. In the illustrated embodiment, the heating region 84 has a width of about 300 μm, a length of about 500 μm and a depth of about 0.1 μm. The light-receiving areas 61A and 61B are also defined in respective parts of the surface semiconductor layer 61b by introducing a p-type dopant (e.g., boron) thereto. When the light beams enter the light-receiving areas 61A and 61B, current flows between each of these areas 61A and 61B and the substrate region 61a as a result of photoelectric conversion like that observed in a solar cell. In this manner, the intensities of the beams received are detected.

By applying voltages V1 and V2 (where V1≠V2) from electrodes (not shown) to both ends of the heating region 84, kinks can also be eliminated from the low-temperature I-L characteristic of the semiconductor laser diode 11 as in the first embodiment.

Suppose the voltages applied to the substrate region 61a and the light-receiving area 61A are denoted by V0 and V3, respectively. In that case, inequalities V0>V1, V0>V2 and V0>V3 should be met according to this embodiment. The reasons will be described below.

Firstly, if the voltage V3 applied to the light-receiving areas 61A and 61B and the voltage V0 applied to the substrate region 61a are reverse biased to the pn junction, then the photoelectric conversion efficiency and response speed can be increased.

Secondly, if the voltage V1 (or V2) applied to the heating region 84 and the voltage V0 applied to the substrate region 61a are reverse biased to the pn junction, then a depletion layer is formed around the heating region 84. As a result, electrical insulation is ensured between the heating region 84 and the light-receiving area 61A (or 61B) and between the light-receiving areas 64A and 64B themselves.

Accordingly, the potential V0 in the substrate region 61a should preferably be higher than any other voltage V1, V2 or V3. That is to say, V0>V1, V0>V2 and V0>V3 should be met. Optionally, the conductivity types of the semiconductor substrate and the doped regions may be reversed. That is to say, the light-receiving areas and the heating region may be defined as n-type doped regions in a p-type semiconductor substrate (and surface semiconductor layer). In that case, the potential V0 in the substrate region 61a is preferably lower than any other voltage V1, V2 or V3.

Figure 7:
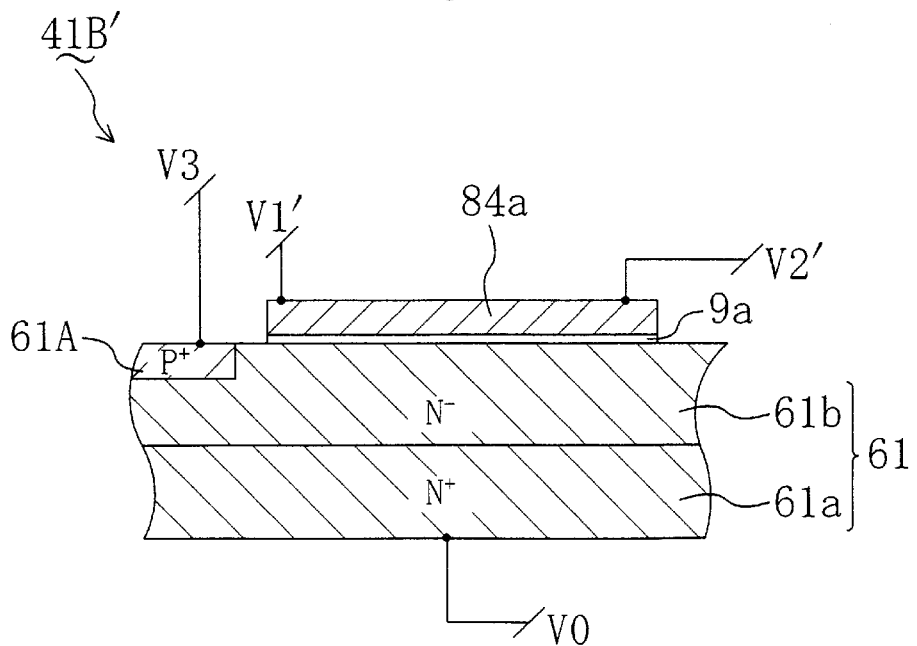
FIG. 7 is a cross-sectional view illustrating a semiconductor light-emitting unit according to a modified example of the second embodiment.

FIG. 7 is a cross-sectional view illustrating a semiconductor light-emitting unit 41B' according to a modified example of the second embodiment. The cross section illustrated in FIG. 7 is also taken along the line VI—VI shown in FIG. 5. In this modified example, the heating region 84a is not a doped region defined within the semiconductor substrate, but a doped polysilicon film formed on the semiconductor substrate. Also, an insulating layer 9a of silicon dioxide, for example, is interposed between the heating region 84a and the semiconductor substrate. As in the second embodiment, the semiconductor substrate also includes the substrate region 61a and the surface semiconductor layer 61b and the light-receiving area 61A is also defined in part of the surface semiconductor layer 61b by introducing a high-concentration p-type dopant thereto.

In this modified example, the doped polysilicon film, functioning as the heating region 84, is a polysilicon film doped with an n- or p-type dopant at a dose of about $5 \times 10^{18}$ atoms·cm$^{-3}$. The width, thickness and length of the doped polysilicon film are about 300 μm, about 1.5 μm and about 700 μm, respectively.

As in the second embodiment, heat can also be generated from the heating region 84a according to this modified example by applying voltages V1' and V2' (where V1'≠V2') to both ends of the heating region 84a. As a result, the same effects are attainable. In this modified example, these voltages V1' and V2' are selectable regardless of the voltages V0 and V3 applied to the substrate region 61a and the light-receiving area 61A. But V0 still has to be higher than V3 as in the second embodiment.

Embodiment 3

Next, a third embodiment of the present invention will be described. In the third embodiment, the heating region is defined under the recess of the photodetector.

Figure 8:
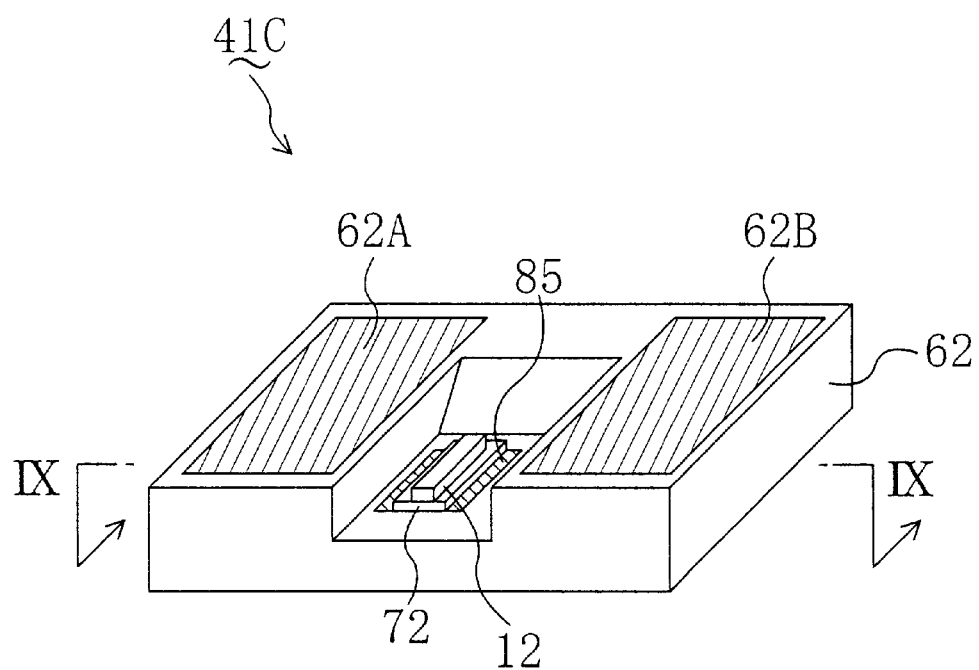
FIG. 8 is a perspective view schematically illustrating a construction of a semiconductor light-emitting unit according to a third embodiment of the present invention.

FIG. 8 is a perspective view schematically illustrating a construction of a semiconductor light-emitting unit 41C according to the third embodiment. As shown in FIG. 8, a recess is also formed in a photodetector 62, which also serves as a sub-mount, by removing part of a semiconductor substrate from its upper surface to a certain depth. On the bottom of the recess, a semiconductor laser diode 12, which is an exemplary semiconductor light-emitting diode, is placed with an Au heat-dissipating layer 72 and an insulating layer (not shown in FIG. 8) interposed therebetween. One side face of the recess functions as a mirror tilted by about 45 degrees from the principal surface of the substrate. As in the second embodiment, the laser radiation emitted horizontally from the semiconductor laser diode 12 is also reflected from the mirror almost vertically upward. Light-receiving areas 62A and 62B, which together make a light receiver, are also defined on right- and left-hand sides of the recess on the upper surface of the photodetector 62. Specifically, the laser radiation, emitted from the semiconductor laser diode 12, is reflected vertically upward from the mirror of the recess so as to be incident on an information storage medium (not shown). Then, the light, which has been reflected from the storage medium, is divided by a hologram (not shown) into two light beams to be received at the light-receiving areas 62A and 62B, respectively.

The third embodiment is different from the second embodiment in that the heating region 85 is not defined on the upper surface of the semiconductor substrate (or the photodetector 62) but located under the semiconductor laser diode 12 (i.e., under the bottom of the recess).

Figure 9:
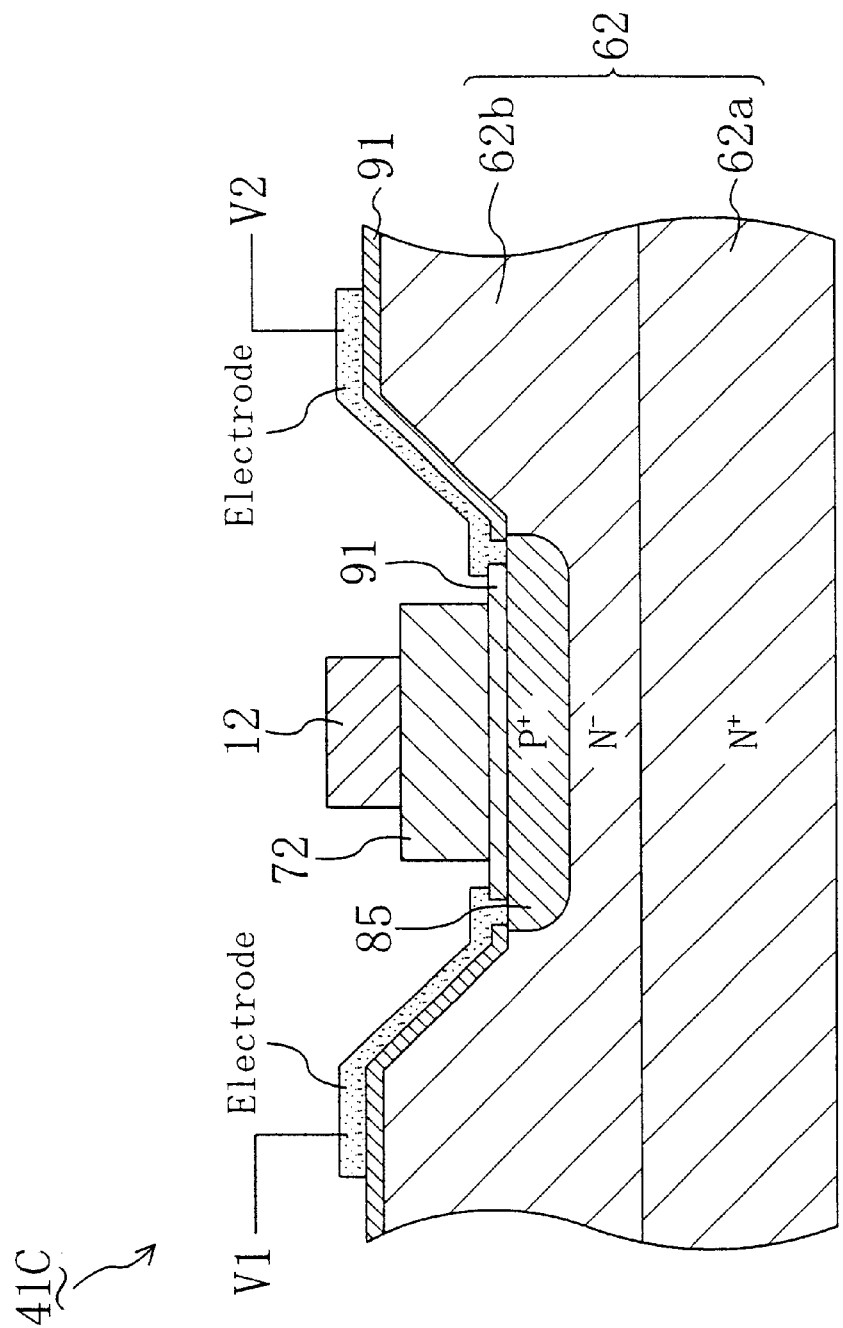
FIG. 9 is a cross-sectional view of the unit taken along the line IX—IX shown in FIG. 8.

FIG. 9 is a cross-sectional view of the semiconductor light-emitting unit 41C taken along the line IX—IX shown in FIG. 8. As shown in FIG. 9, the semiconductor substrate (e.g., silicon substrate) functioning as the photodetector 62 also includes: a substrate region 62a containing a high-concentration n-type dopant (e.g., arsenic); and a surface semiconductor layer 62b containing a low-concentration n-type dopant (e.g., arsenic). In FIG. 9, the substrate region 62a and the surface semiconductor layer 62b are illustrated as n$^+$-type and n$^-$-type layers, respectively. The surface semiconductor layer 62b is located over the substrate region 62a. In the photodetector 62, the heating region 85 is also defined in part of the surface semiconductor layer 62b, which is exposed on the bottom of the recess, by introducing a p-type dopant (e.g., boron) thereto at a dose of about $5 \times 10^{18}$ atoms·cm$^{-3}$. In FIG. 9, the heating region 85 is illustrated as a p$^+$-type layer. In the illustrated embodiment, the heating region 85 has a width of about 500 μm, a length of about 500 μm and a depth of about 0.1 μm.

An insulating layer 91 of CVD silicon dioxide is deposited to a thickness of about 1 μm on the respective surfaces of the heating region 85 (i.e., on the bottom of the recess) and the surface semiconductor layer 62b. A heat-dissipating layer 72 of gold (Au) is further deposited to a thickness of about 1.2 μm on that part of the insulating layer 91 located over the heating region 85. And the semiconductor laser diode 12, which is an exemplary semiconductor light-emitting diode, is placed on the heat-dissipating layer 72. In addition, contact holes, reaching both ends of the heating region 85, are further provided in the insulating layer 91 and are filled in with aluminum, thereby forming two electrodes extending over the insulating layer 91. By applying voltages V1 and V2 (where V1≠V2) through these electrodes to both ends of the heating region 85, kinks can also be eliminated from the low-temperature I-L characteristic of the semiconductor laser diode 12. In FIG. 8, the two side faces of the recess are schematically illustrated as intersecting with the bottom of the recess at right angles. Actually, though, these two side faces are not vertical but tilted as in the cross-sectional view illustrated in FIG. 9.

As in the second embodiment, the light-receiving areas 2A and 62B are also defined in respective parts of the surface semiconductor layer 62b by introducing a p-type dopant (e.g., boron) thereto. When the light beams enter the light-receiving areas 62A and 62B, current flows between each of these areas 62A and 62B and the substrate region 62a as a result of photoelectric conversion like that observed in a solar cell. In this manner, the intensities of the beams received are detected.

In the fabrication process of the semiconductor light-emitting unit 41C of the third embodiment, the recess is formed in the surface semiconductor layer 62b by etching away part of the layer 62b and an acceptor (i.e., the p-type dopant) is diffused under the bottom of the recess. In this manner, the heating region 85 is defined. Thereafter, a silicon dioxide film is deposited over the substrate by a CVD process and then patterned to form the insulating layer 91 covering the respective surfaces of the heating region 85 and the surface semiconductor layer 62b. Subsequently, the heat-dissipating layer 72 of gold (Au) is formed on that part of the insulating layer 91 located over the heating region 85 by a lift-off technique, for example.

Suppose the voltages applied to the substrate region 62a and the light-receiving area 62A or 62B are denoted by V0 and V3, respectively. In that case, the inequalities V0>V1, V0>V2 and V0>V3 should also be met according to this embodiment because of the same reasons as those described in the second embodiment.

According to the third embodiment, the heating region 85 is defined under the bottom of the recess unlike the second embodiment. That is to say, since the heating region 85 is closer to the semiconductor laser diode 12, the laser diode 12 can be heated more efficiently. In addition, heating of the light-receiving areas 62A and 62B can also be minimized. Accordingly, even if the sensitivity of the light-receiving areas 62A and 62B of the photodetector 62 depends on the temperature, that variation in photo-detection sensitivity due to heat can be suppressed advantageously.

In this case, the heat-dissipating layer 72 needs to dissipate heat not only by radiating the heat into the air but also conducting the heat into the semiconductor substrate, and therefore should preferably be deposited to a thickness between 10 and 20 $\mu$m. To keep the heat-dissipating layer 72 and the heating region 85 electrically insulated from each other, the insulating layer 91 is preferably deposited to a thickness of 0.1 $\mu$m or more. However, to conduct a sufficient quantity of heat from the heating region 85 to the semiconductor laser diode 12, the insulating layer 91 should have a thickness of 1.5 $\mu$m or less. That is to say, the thickness of the insulating layer 91 is preferably in the range from 0.1 $\mu$m to 1.5 $\mu$m, both inclusive. We confirmed that when the Au heat-dissipating layer 72 and the CVD silicon dioxide insulating layer 91 were 10 and 1 $\mu$m thick, respectively, the resultant thermal conductivity increased by about 20% compared to a structure in which these layers were combined and both made of silicon alone.

Figure 10:
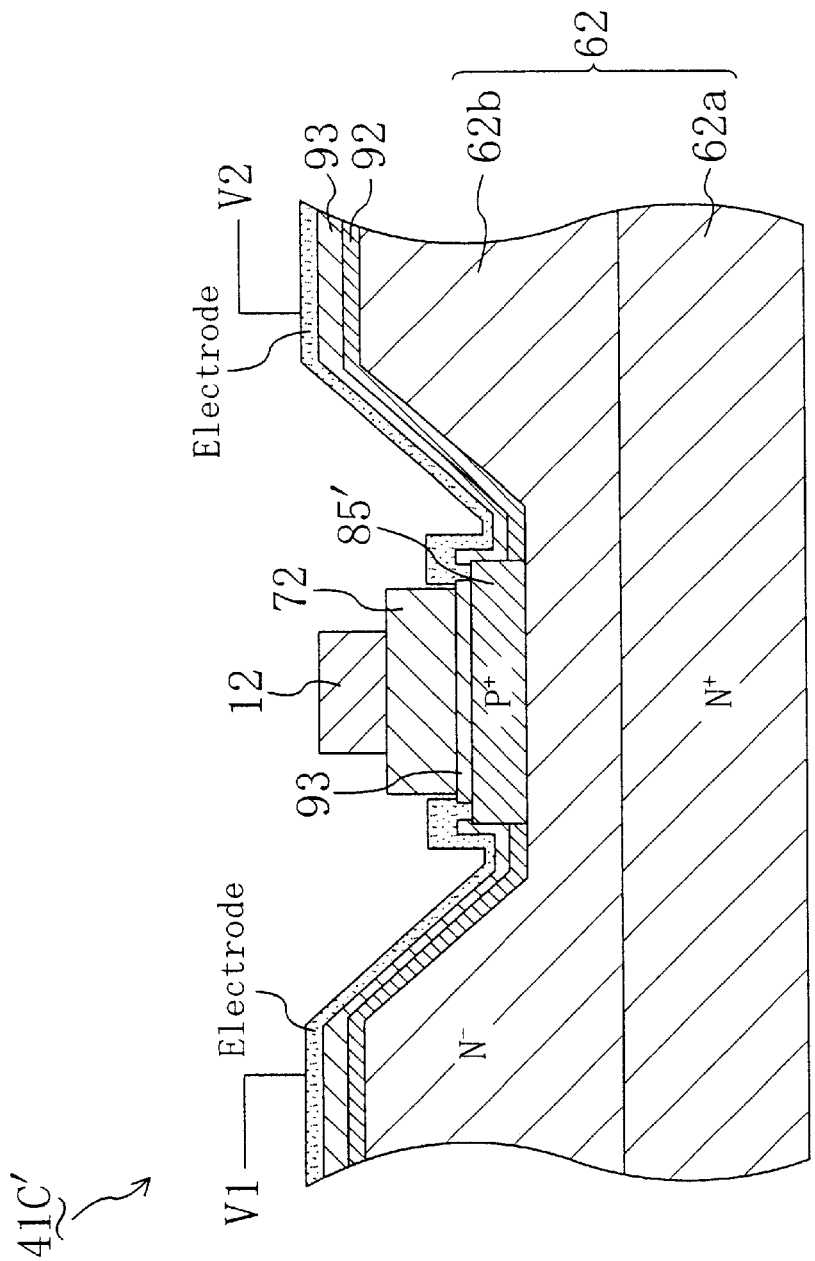
FIG. 10 is a cross-sectional view illustrating a semiconductor light-emitting unit according to a modified example of the third embodiment.

Next, a modified example of the third embodiment will be described. FIG. 10 is a cross-sectional view illustrating a semiconductor light-emitting unit 41C' according to a modified example of the third embodiment. The cross section illustrated in FIG. 10 is also taken along the line IX—IX shown in FIG. 8.

In this modified example, part of the semiconductor substrate has been etched away so deep that the bottom of the recess reaches the substrate region 62a. As a result, the heating region 85' is in contact with the substrate region 62a and protrudes upwards from the bottom of the recess.

Such a structure may be obtained through the following process. Specifically, first, the recess is formed by etching away that part of the semiconductor substrate to such a depth as passing through the surface semiconductor layer 62b (i.e., n$^-$-type layer) and reaching the substrate region 62a (i.e., n$^+$-type layer). Thereafter, a polysilicon film containing a p-type dopant may be formed on the bottom of the recess by CVD process and etching technique. Alternatively, a single crystal silicon film containing a p-type dopant may be epitaxially grown on the bottom of the recess.

In this modified example, by forming the heating region 85' on the bottom of the recess after the recess has been formed by etching, the following effects are attainable. The surface semiconductor layer 62b and the substrate region 62a, i.e., the n$^-$-type and n$^+$-type layers, have mutually different dopant concentrations, and therefore are etched at different rates while the recess is being formed. Thus, if the etching process is stopped when the substrate region 62a is exposed, then an accurate etch depth can be obtained just as intended. In addition, since the heating region 85' is formed on the bottom of the recess after the recess has been defined, the area and the characteristic of the heating region 85' are controllable precisely.

Alternatively, the heating region may also be formed by diffusing a dopant inside the substrate region 62a after the recess, reaching the substrate region 62a, has been defined. In that case, only the former effect is attainable. Also, after the recess has been defined in the surface semiconductor layer 62b, the heating region 85' may be formed to protrude upward from the bottom of the recess. In that case, only the latter effect is attainable.

Embodiment 4

Next, a fourth embodiment of the present invention will be described. The fourth embodiment relates to an optical head apparatus (optical pickup), which includes not only the semiconductor light-emitting unit but also a temperature sensor. The fourth embodiment also relates to an optical disk system (optical disk drive) further including circuitry like a controller and a disk holder.

Figure 11:
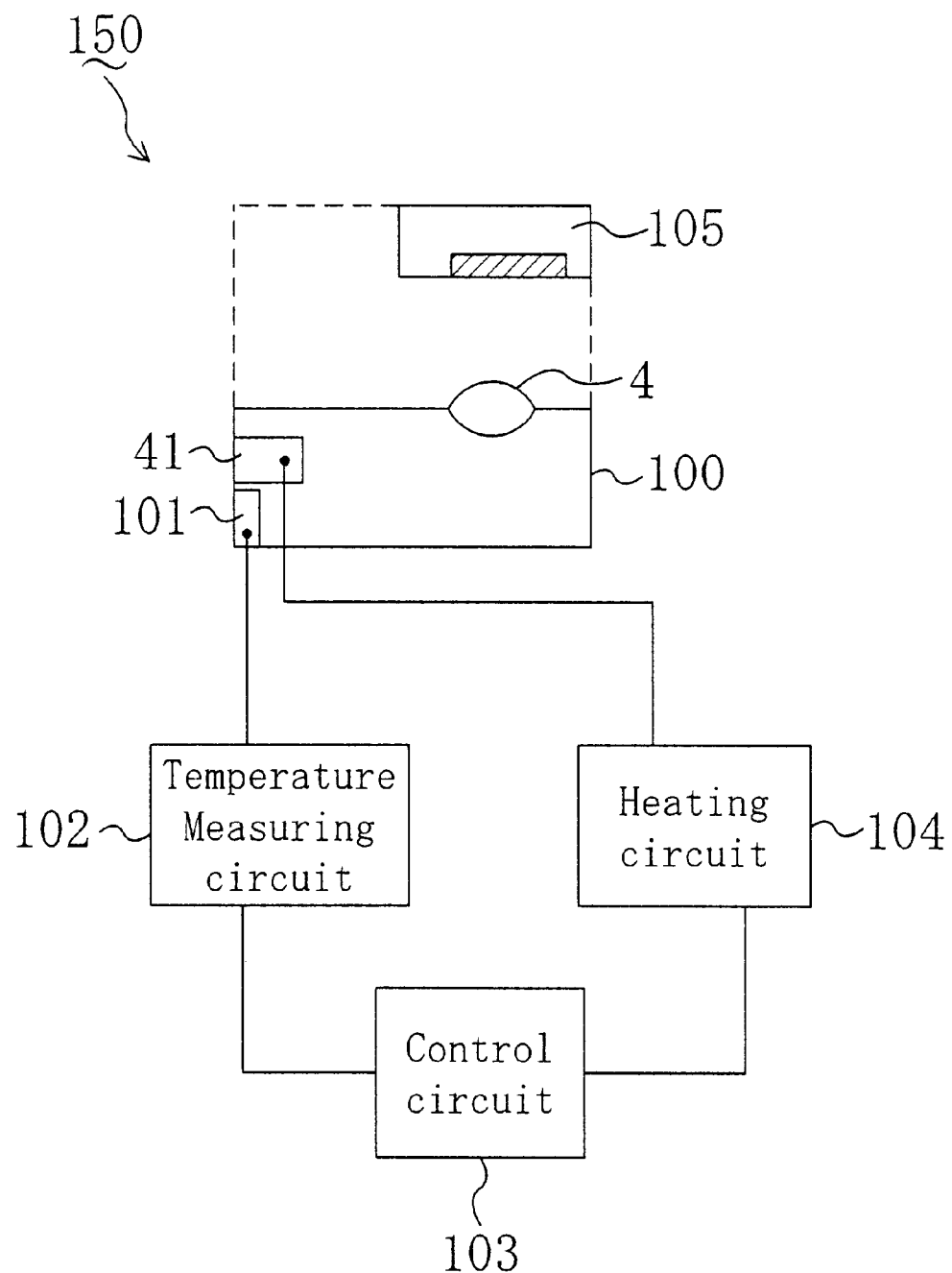
FIG. 11 is a block diagram schematically illustrating a configuration for an optical disk system according to a fourth embodiment of the present invention.

FIG. 11 is a block diagram schematically illustrating a configuration for an optical disk system 150 according to the fourth embodiment. As shown in FIG. 11, the optical disk system 150 includes optical head apparatus 100, temperature measuring circuit 102, control circuit 103, heating circuit 104 and disk holder 105. The optical head apparatus 100 includes the semiconductor light-emitting unit 41 according to any of the foregoing embodiments, a temperature sensor 101 and an objective lens 4. The temperature sensor 101 senses the ambient temperature of the semiconductor laser diode. The objective lens 4 is part of an optical system, disposed between the light-emitting unit 41 and an information storage medium (disk), for passing the laser radiation between them. Responsive to a signal provided from the temperature sensor 101, the temperature measuring circuit 102 estimates the ambient temperature of the semiconductor laser diode. The control circuit 103 receives the output of the temperature measuring circuit 102 and controls the ON/OFF states and the value of the voltage applied to the heating region. The heating circuit 104 applies the voltage to the heating region in response to a control signal provided from the control circuit 103. And the disk holder 105 holds the information storage medium, on which the laser radiation is focused by the objective lens 4 of the optical head apparatus 100.

In the optical disk system 150 of the fourth embodiment, the information obtained by the temperature sensor 101 is processed by the temperature measuring circuit 102 and then provided to the control circuit 103. If the estimated temperature is found too low, then the control circuit 103 drives the heating circuit 104, thereby supplying current to the heating region of the unit 41 in the optical head apparatus 100. Optionally, the control circuit 103 may be incorporated into the semiconductor light-emitting unit 41 or the optical head apparatus 100.

To measure the ambient temperature of the semiconductor laser diode accurately, the temperature sensor 101 is preferably disposed as close to the semiconductor laser diode as possible in the optical head apparatus 100. The temperature sensor 101 may be a thermocouple or a resistor. When the sensor 101 is implemented as a thermocouple, the temperature can be sensed as an electromotive force, which is directly proportional to the temperature difference and developed between two electrical conductors of dissimilar metals. Thus, the temperature can be sensed relatively accurately. On the other hand, when the sensor 101 is implemented as a resistor, the temperature can be sensed by a resistance value changing with the temperature. In such a case, this resistor can be shared with the control circuit and a signal processing circuit. Accordingly, the temperature can be sensed at a relatively low cost without increasing the number of components and with the required space reduced.

Figure 12:
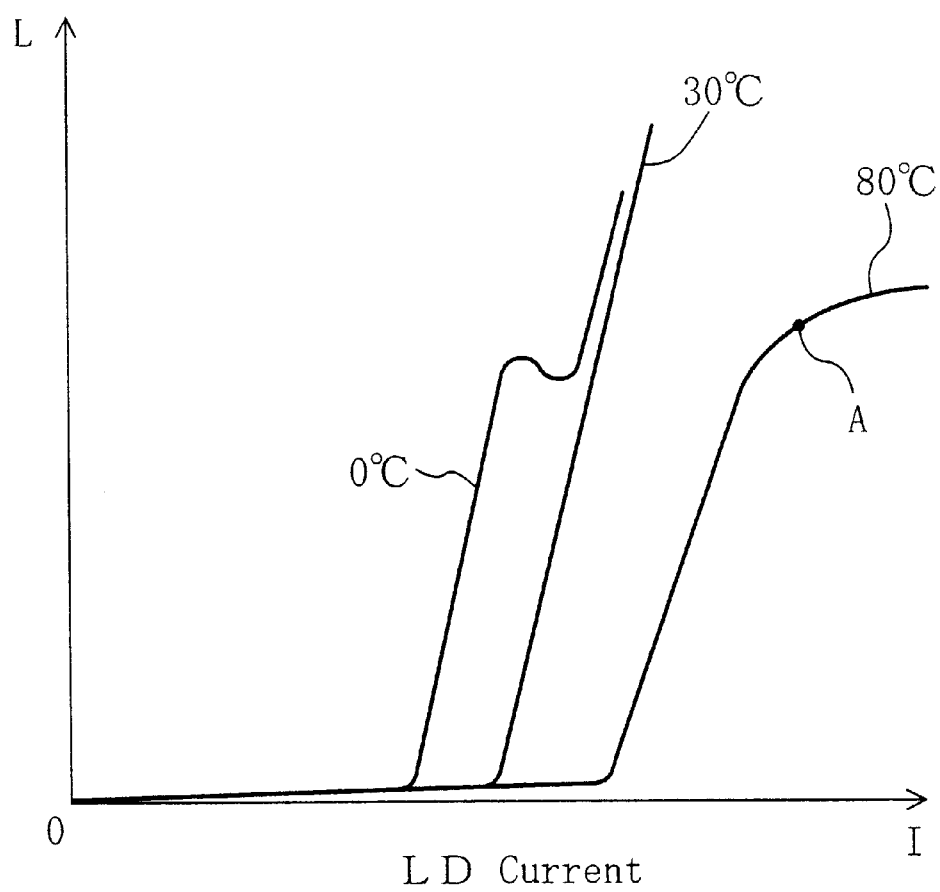
FIG. 12 is a graph illustrating normal emission characteristics of a semiconductor laser diode.

Also, the relationship between the current I injected into the semiconductor laser diode and the emission intensity L thereof is preferably defined in advance using the temperature as a parameter as shown in FIG. 12. In that case, the temperature of the semiconductor laser diode can be known from the emission intensity L corresponding to a predetermined current I. Or the temperature of the laser diode can also be known from a threshold current value (i.e., a point where the emission intensity L rises in FIG. 12). Accordingly, that temperature may be regarded as the temperature of the semiconductor laser diode. In this manner, the temperature can also be measured at a relatively low cost and with the required space reduced as in the embodiment where a resistor is used.

Furthermore, if a bimetal is used as the temperature sensor and a temperature switch, then the sensor can also function as a controller that can selectively turn ON or OFF heating.

According to the fourth embodiment, the temperature sensor and control system are provided for the semiconductor light-emitting unit, optical head apparatus or optical disk system (optical disk drive) as shown in FIG. 11. Thus, kinks can be easily eliminated from the low-temperature I-L characteristic of the laser diode.

Also, in the optical head apparatus 100 and the optical disk system (optical disk drive) 150 including the apparatus 100 according to the fourth embodiment, even if the ambient temperature is low, the heating mechanism is activated to eliminate kinks from the low-temperature I-L characteristic of the semiconductor laser diode. Thus, information can be written, read or erased onto/from the information storage medium (optical disk) just as intended.

In this embodiment, only the control system is provided to eliminate kinks from the low-temperature I-L characteristic. Alternatively, the heat-dissipating layer of the foregoing embodiments may be replaced with a Peltier device, and the cooling process may be controlled to eliminate kinks from the I-L characteristic.

In the foregoing description, kinks are supposed to be caused in both the high- and low-temperature I-L characteristics of a semiconductor laser diode. However, the present invention is also applicable to a situation where kinks are caused in the I-L characteristic only when the ambient temperature is 35° C. or less.

Also, in the foregoing embodiments, the present invention is assumed to be applicable to the elimination of kinks from the I-L characteristic of a semiconductor laser diode. However, if any other characteristic of a semiconductor laser diode, such as wavelength, noise or far field pattern of emission, is improvable by heating, the present invention can also contribute to such improvement.

Furthermore, although the present invention has been described as being applied to a semiconductor laser diode operating in the infrared region of the spectrum, the present invention is applicable to any semiconductor laser diode with its characteristic improvable by heating. Thus, the present invention is not limited by the wavelength at which the laser diode operates.

Moreover, the present invention is naturally applicable to any light-emitting diode for use in illumination and optical communication.

What is claimed is:

1. A semiconductor light-emitting unit comprising:
   a semiconductor light-emitting diode;
   a sub-mount for mounting the diode thereon, the sub-mount comprising a semiconductor substrate;
   a heating member incorporated with the sub-mount for heating the diode, the heating member being located below the diode; and
   an insulating layer and a heat-dissipating conductor layer that are formed between the heating member and the diode,
   wherein the heating member comprises a resistor and a doped region defined inside the substrate.

2. The unit of claim 1, wherein the thickness of the insulating layer is in the range from 0.1 $\mu$m to 1.5 $\mu$m, both inclusive, and
   wherein the thickness of the conductor layer is in the range from 10 $\mu$m to 20 $\mu$m, both inclusive.

3. A semiconductor light-emitting unit comprising:
   a semiconductor light-emitting diode;
   a sub-mount for mounting the diode thereon, the sub-mount comprising a semiconductor substrate; and
   a heating member incorporated with the sub-mount for heating the diode, the heating member comprising a resistor and a doped region defined inside the substrate,
   wherein the semiconductor substrate has light-receiving areas and functions as a photodetector.

4. The unit of claim 3, wherein the sub-mount has a recess, which is formed by removing part of the substrate from the upper surface thereof, and
   wherein the light-receiving areas are defined on the upper surface of the substrate, and
   wherein the doped region is defined under the bottom of the recess.

5. The unit of claim 4, wherein the semiconductor substrate includes:
   a substrate region containing a dopant of a conductivity type opposite to that of the doped region; and
   a surface semiconductor layer of the same conductivity type as that of the substrate region, the semiconductor layer being formed over the substrate region and having a dopant concentration lower than that of the substrate region, and wherein the bottom of the recess reaches the substrate region.

6. An optical head apparatus comprising:

a semiconductor light-emitting diode;

means for heating the diode up to such a temperature as substantially eliminating kinks from a low-temperature I-L characteristic of the diode;

means for sensing the temperature of the diode;

a photodetector with light-receiving areas; and an insulating layer and a heat-dissipating conductor layer that are formed between the heating means and the diode.

7. An optical disk system comprising:

a member for holding an information storage medium;

a semiconductor light-emitting diode;

means for heating the diode;

means for sensing the temperature of the diode;

a controller for controlling the heating means and getting the diode heated by the heating means up to such a temperature as substantially eliminating kinks from a low temperature I-L characteristic of the diode if the temperature of the diode sensed by the sensing means falls within a range where the kinks are possibly caused in the low-temperature I-L characteristic;

a photodetector with light-receiving areas; and an insulating layer and a heat-dissipating conductor layer that are formed between the heating means and the diode.

8. The system of claim 7, wherein the sensing means senses the temperature of the diode from an operating current value of the diode corresponding to a predetermined emission intensity of the diode.

9. The system of claim 7, wherein the sensing means senses the temperature of the diode from a threshold current value of the diode.

10. The system of claim 7, wherein the heating means is incorporated with the photodetector.

11. The system of claim 7, further comprising means for cooling down the diode, wherein the controller controls the heating and cooling means such that the temperature of the diode falls within a range in which substantially no kinks are caused in the low- or high-temperature I-L characteristic of the diode.

* * * * *